US006260181B1

(12) United States Patent
Inoue

(10) Patent No.: US 6,260,181 B1
(45) Date of Patent: Jul. 10, 2001

(54) INTEGRATED CIRCUIT AND THE DESIGN METHOD THEREOF

(75) Inventor: Toru Inoue, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/179,387

(22) Filed: Oct. 27, 1998

(30) Foreign Application Priority Data

May 7, 1998 (JP) .................................................. 10-124387

(51) Int. Cl.⁷ ...................................................... G06F 17/50
(52) U.S. Cl. .................................................................. 716/10
(58) Field of Search ............................................ 716/1–21

(56) References Cited

U.S. PATENT DOCUMENTS

| | | | |
|---|---|---|---|
| 5,077,676 | * 12/1991 | Johnson et al. ............................ | 716/6 |
| 5,388,055 | * 2/1995 | Tanizawa et al. .......................... | 716/9 |
| 5,448,493 | * 9/1995 | Topolewski et al. ...................... | 716/7 |
| 5,557,779 | * 9/1996 | Minami ...................................... | 716/6 |
| 5,638,291 | * 6/1997 | Li et al. .................................... | 716/18 |
| 5,774,371 | * 6/1998 | Kawakami ................................. | 716/10 |
| 5,784,600 | * 7/1998 | Doreswamy et al. .................... | 713/503 |
| 5,912,820 | * 6/1999 | Kerzman et al. .......................... | 716/6 |
| 5,995,735 | * 11/1999 | Le .............................................. | 716/13 |
| 6,080,206 | * 6/2000 | Tadokoro et al. ......................... | 716/10 |

OTHER PUBLICATIONS

Mehta et al. ("Clustering and Local Balancing for Buffered Clock Tree Synthesis", IEEE, Jan. 1997, pp. 217–223).*

* cited by examiner

*Primary Examiner*—Matthew Smith
*Assistant Examiner*—Phallaka Kik
(74) *Attorney, Agent, or Firm*—Wenderoth, Lind & Ponack, L.L.P.

(57) ABSTRACT

With this invention, the clock skew of logical integrated circuits is suppressed. To do this, with this invention, chip integrated circuit forming areas are divided into rectangular blocks with the same dimensions, clock drivers are placed in each block, and these clock drivers are connected with basic logic circuits and dummy loads. The total basic logic circuit count and dummy load count is made the same for all clock drivers. This allows the load of each clock driver to be made the same, so generation of clock skew can be suppressed.

18 Claims, 7 Drawing Sheets

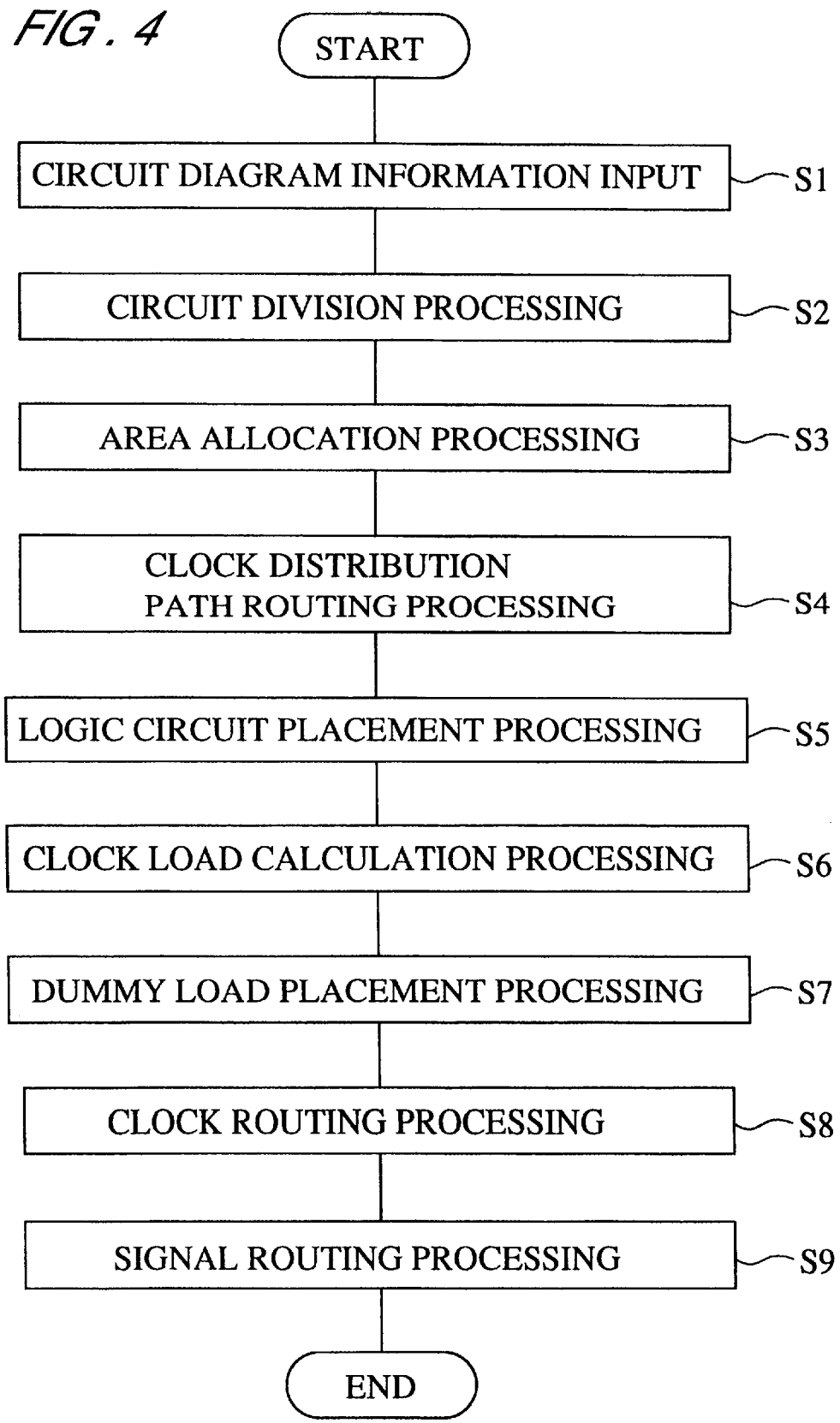

INTEGRATED CIRCUIT AND THE DESIGN METHOD THEREOF

BACKGROUND OF THE INVENTION

1. Field of the Invention

This invention concerns an integrated circuit and the design method thereof, and specifically concerns an integrated circuit with clock skew suppressed and the design method for realizing this suppression.

2. Description of Related Art

Logical integrated circuits are formed by combining basic logic circuits such as AND circuits, OR circuits, and flip flops. Generally, the logic circuits within an integrated circuit are designed to operate according to the timing given by one type of clock signal. This arrangement is used to provide reliable execution of operations such as data input and output between integrated circuits and external circuits and data sending and transmission between each part of circuits installed within an integrated circuit according to a fixed sequence.

With the design of integrated circuits, suppression of clock skew is vital. Clock skew means causing a dispersion in delay time of clock signals that reach each basic logic circuit and causing phase difference in these clock signals. For integrated circuit design, when determining placement of basic logic circuits or a routing pattern for clock signals, etc., mechanisms are employed to suppress the occurrence of clock skew.

Generally, with integrated circuits, multiple driver circuits for clock signals are installed. To each clock driver is connected one or multiple basic logic circuits. As a design method for suppressing the generation of clock skew in this case, we can list methods such as making the wiring length or wiring width of the integrated circuit clock input terminal and each clock driver the same, or making each clock driver drive capacity the same.

However, even if the wiring length, wiring width, or drive capacity are made the same, when there is a different number of basic logic components connected to each clock driver, it is impossible to completely suppress the generation of clock skew. This is because the size of the load of the clock driver differs according to the number of basic logic components connected to the clock driver. This load size depends on items such as the total value of parasitic resistance due to the wiring from each clock driver to each basic logic circuit, the total value of the parasitic capacitance of this wiring, and the total value of the input impedance of each basic logic circuit. Then, to change the delay time of clock signals according to the load size, clock skew is generated between clock drivers.

Clock skew generated due to such reasons becomes a cause of faulty operation of integrated circuits. Especially in recent years, the operating speed demanded for integrated circuits is accelerating, so suppressing the clock skew generated due to dispersion of driver circuit loads is an important task.

SUMMARY OF THE INVENTION

The object of this invention is to provide an integrated circuit with clock skew suppressed, in other words, an integrated circuit for which high speed logical operation is possible, and to provide a design method for such an integrated circuit.

To do this, the integrated circuit of this invention is equipped with multiple blocks installed in the chip integrated circuit formation area, clock drivers formed in each block, basic logic circuits connected to the corresponding clock driver, and a device for adjusting the drive capacity of these clock drivers connected to each clock driver.

For the integrated circuit of this invention, when using a dummy load circuit as the device for adjusting drive capacity, by making the load of each clock driver the same, it is possible to suppress clock skew.

Also, for the integrated circuit of this invention, when using an inverter within the clock driver as the device for adjusting drive capacity, it is possible to suppress clock skew by adjusting the internal impedance of this inverter.

The integrated circuit design method of this invention, comprise dividing the integrated circuit into multiple blocks based on a net list, dividing the chip integrated circuit formation area into multiple areas and allocating a block to each area, placing a clock driver in each block and performing routing to supply clock signals to these clock drivers, placing basic logic circuits in blocks, adjusting the drive capacity of the clock drivers, and performing routing between basic logic components.

For the integrated circuit design method of this invention, with the adjusting step, when placing multiple or capacitance dummy load circuits determined according to the clock driver load in each block, it is possible to suppress clock skew by making the load of each clock driver the same.

Also, for the integrated circuit design method of this invention, with the adjusting step, when replacing the clock drivers with drive capacity adjustment device which have multiple level inverters, it is possible to suppress clock skew by adjusting the internal impedance of any inverter.

BRIEF DESCRIPTION OF THE DRAWINGS

The foregoing and other objects, features and advantages of the present invention will be better understood from the following description taken in connection with the accompanying drawings in which:

FIG. 4 is a flow chart which explains the integrated circuit design method of the first preferred embodiment;

DESCRIPTION OF THE PREFERRED EMBODIMENTS

First Preferred Embodiment

A first preferred embodiment of this invention is discussed next while referring to FIGS. 1 through 4.

Figure 1:
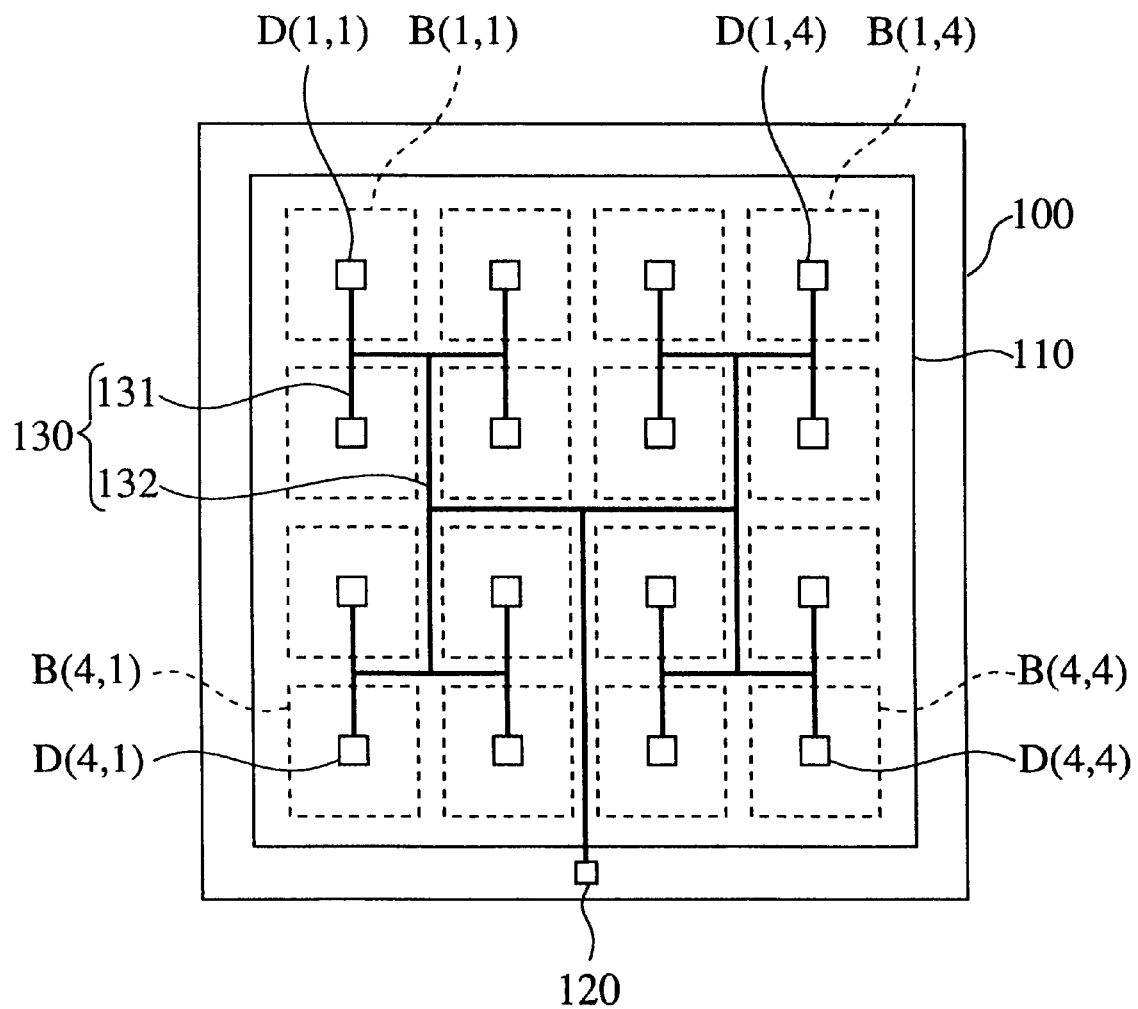
FIG. 1 is a planar diagram giving a summary view of the overall structure of the integrated circuit of the first preferred embodiment.

As shown in FIG. 1, integrated circuit forming area 110 of semiconductor chip 100 is segmented into nxm circuit blocks B(1, 1) to B(n, m) (in FIG. 1, n=m=4). Each block B(1, 1) to B(n, m) is a rectangular area with the same dimensions. As described later, a circuit which has a basic logic circuit such as an AND circuit, OR circuit, or flip flop and a dummy load circuit are formed within these blocks B(1, 1) to B(n, m) (see FIG. 2).

In the approximate center of each block B(1, 1) to B(n, m), a clock driver D(1, 1) to D(n, m) with the same standards (i.e. same drive capacity) is installed. Each driver D(1, 1) to D(n, m) amplifies the input clock signal, and this is supplied to each basic logic circuit and dummy load circuit within the corresponding block B(1, 1) to B(n, m).

Clock input terminal 120 inputs a clock signal from an external source. This input terminal 120 and each driver D(1, 1) to D(n, m) is connected by an H type pattern combined to form wiring (clock tree) 130. In other words, in the case shown in FIG. 1, four blocks B(1, 1), B(1, 2), B(2, 1), and B(2, 2) are connected to each other by H type wiring pattern 131, and these form one group. In the same way, other blocks are also connected four at a time by H type wiring pattern 131, forming separate groups. Also, each group is connected to each other by H type wiring pattern 132. Then, wiring pattern 132 is connected to input terminal 120 by wiring pattern 133. In this way, by connecting each driver D(1, 1) to D(n, m) using H type clock tree 130, it is easy to design wiring pattern 130 (in other words, wiring pattern 130 for which the total value of the parasitic resistance due to wiring and the total value of the parasitic capacitance are the same for each driver D(1, 1) to D(n, m)) for which the wiring length and wiring width of input terminal 120 and each driver D(1, 1) to D(n, m) are the same.

Figure 2:
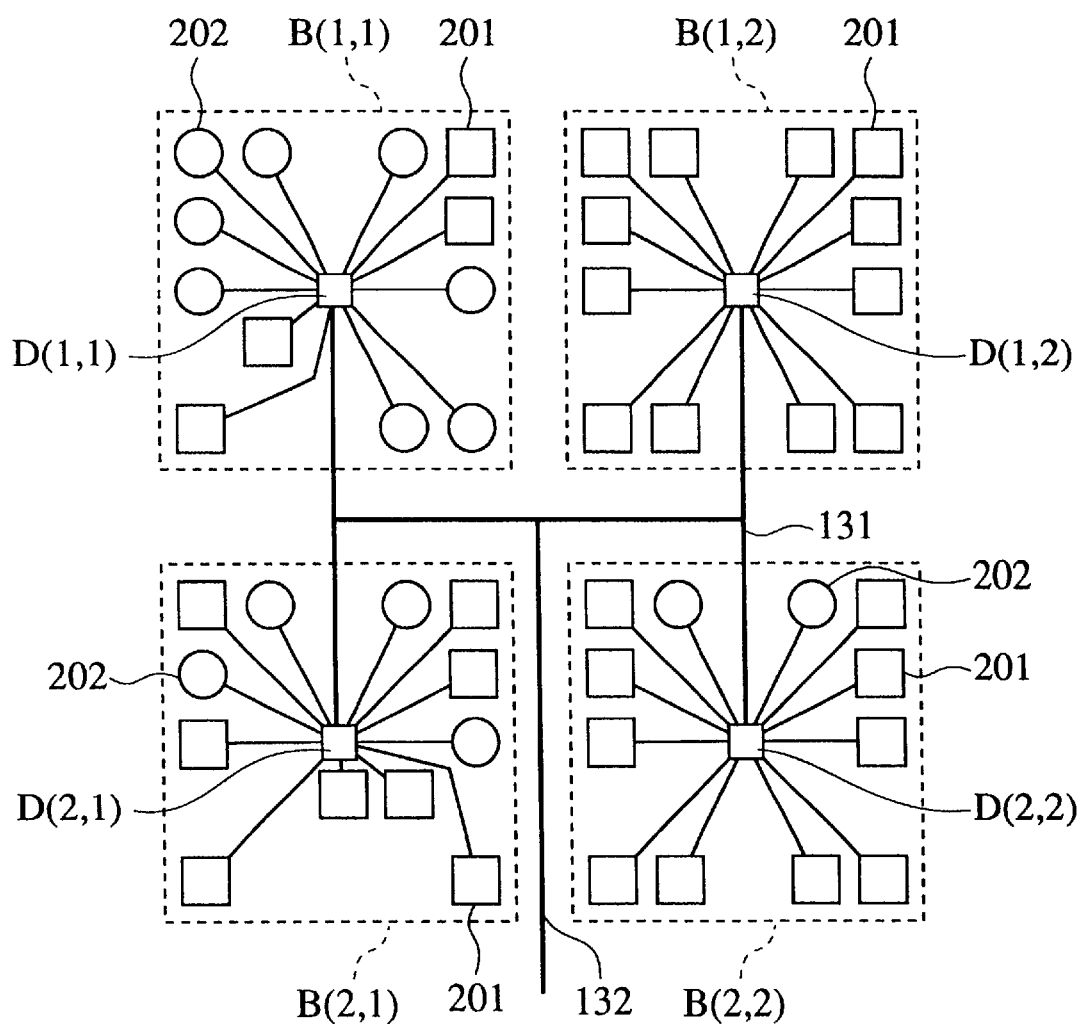
FIG. 2 is a partial enlargement of FIG. 1.

As shown in FIG. 2, within each block B(1, 1) to B(n, m), in addition to drivers D(1, 1) to D(n, m), a circuit is formed which has basic logic circuit 201 as well as dummy load circuit 202.

Basic logic circuit 201 and dummy load 202 are each connected to the driver within the same block. Drivers D(1, 1) to D(n, m) amplify the clock signal input from input terminal 120, and this is supplied to circuits 201 and 202 in the same block.

Dummy load 202 is formed to have the same size of the load as that of basic logic circuit 201. A structure such as that shown in FIG. 3 can be used as the structure for this dummy load 202.

Figure 3:
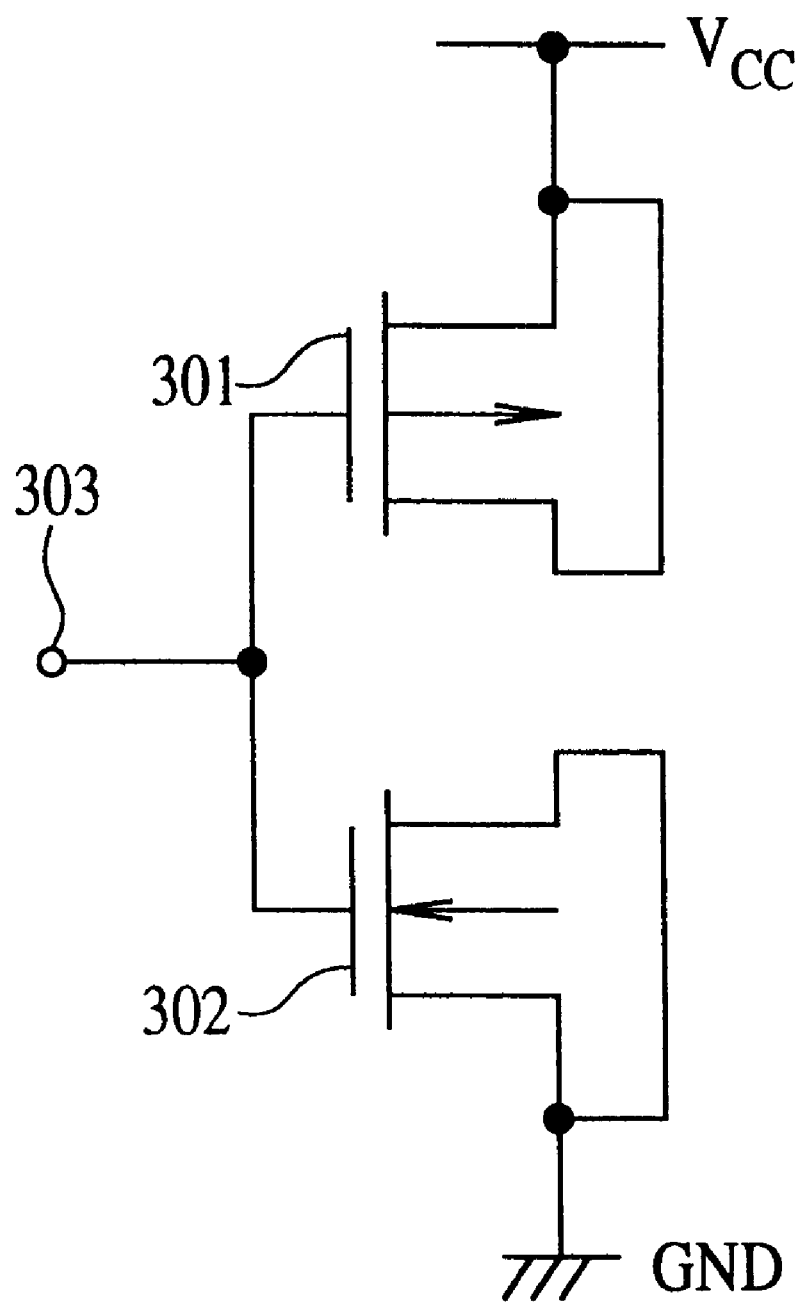
FIG. 3 is a circuit diagram showing the structure of the dummy load circuit shown in FIG. 2.

Dummy load 202 shown in FIG. 3 is equipped with PMOS transistor 301 for which the source and drain are connected to power source line Vcc and with NMOS transistor 302 for which the source and drain are connected to ground line GND. Then, the gates of these transistors 301 and 302 are each connected to a driver via input terminal 303. This dummy load 202 functions as a capacitor with the same gate capacity as basic logic circuit 201.

For each block B(1, 1) to B(n, m), the total number of basic logic circuits 201 together with the number of dummy loads 202 is made the same. In other words, to make this total the same, the number of dummy loads 202 formed within each block B(1,1) to B(n, m) is decided.

For example, in the example shown in FIG. 2, the total count is 12. With block B(1, 2), there are 12 basic logic circuits 201 formed, so no dummy loads 202 are formed. On the other hand, with block B(1, 1), there are 4 basic logic circuits 201, so there are 8 dummy loads 202.

In other words, with the integrated circuit of this preferred embodiment, using dummy load 202, the load of each driver D(1, 1) to D(n, m) is made the same.

Next, we will explain the design procedure for the integrated circuit of this preferred embodiment using FIG. 4 for reference. This design procedure can be realized using a system such as a layout CAD (Computer Aided Design) system.

First, as step S1, an integrated circuit net list is input to the CAD system. A net list is circuit diagram information that shows things such as the connection relationship of basic logic circuits 201 (AND circuit, OR circuit, flip flop, etc.) that form an integrated circuit or the relationship between each basic logic circuit 201 and the clock signals.

Next, as step S2, circuit division processing is performed on a CAD system. With this process, based on the net list, an integrated circuit is divided into n×m circuit blocks.

With step S3, area allocation processing is performed. With this process, first, integrated circuit forming area 110 (see FIG. 1) is divided into n×m rectangular areas of the same dimensions, and next, each circuit block obtained in step S2 is allocated for each area.

With step S4, wiring of the clocks within area 110 is performed. With this process, first, drivers D(1, 1) to D(n, m) are placed near the center of each block, and next, wiring between drivers D(1, 1) to D(n, m) is performed. This wiring is performed by combining H type wiring patterns (see FIG. 1).

With step S5, logic circuit wiring is performed. With this process, the placement of basic logic circuits 201 is decided for each block by referring to basic logic circuit information registered in something such as a library.

With step S6, clock load calculation is performed. With this process, the total value of the load due to the basic logic circuits 201 is calculated for each block. Then, the number of dummy loads 202 needed to make the total value of the load for all blocks the same is calculated for each block.

With step S7, placement of dummy loads 202 is performed. With this process, placement of dummy loads 202 is performed for each block based on the number of dummy loads 202 calculated in step 6 while referring to the dummy load information registered in a library, etc.

With step S8, clock wiring within blocks is performed. With this process, wiring is performed for each driver D(1, 1) to D(n, m) and each circuit 201 and 202.

Finally, with step S9, signal wiring is performed. With this process, wiring is performed between each basic logic circuit 201 based on the net list.

When this kind of layout and wiring processing is completed, the integrated circuit logic operation and timing, etc. is tested using actual wiring simulation, etc. Then, if the logic operation or timing, etc. do not satisfy specified conditions, after making design changes (net list changes, etc.), layout and wiring processing as well as testing are performed again. By repeating this series of processes, the final integrated circuit layout is completed.

As described above, with this preferred embodiment, the parasitic capacitance and parasitic resistance from input terminal 120 to each driver D(1, 1) to D(n, m) are made the same, and the drive capacity of each driver D(1, 1) to D(n, m) is made the same, so it is possible to suppress the clock skew between input terminal 120 and each driver D(1, 1) to D(n, m). Furthermore, with this preferred embodiment, by installing dummy load 202, the load of each driver D(1, 1) to D(n, m) is made the same, so it is possible to suppress the clock skew between driver D(1, 1) to D(n, m) and each basic logic component 201. Therefore, with this preferred embodiment, it is possible to suppress clock skew for the overall integrated circuit, making it possible to provide an integrated circuit for which high speed logic operation is possible.

Also, by forming dummy load 202 using capacitors rather than a logic gate such as an inverter, for example (see FIG. 3), it is possible to suppress the generation of through current when the clock signal value changes, so it is also possible to suppress an increase in power consumption.

Second Preferred Embodiment

Figure 5A:
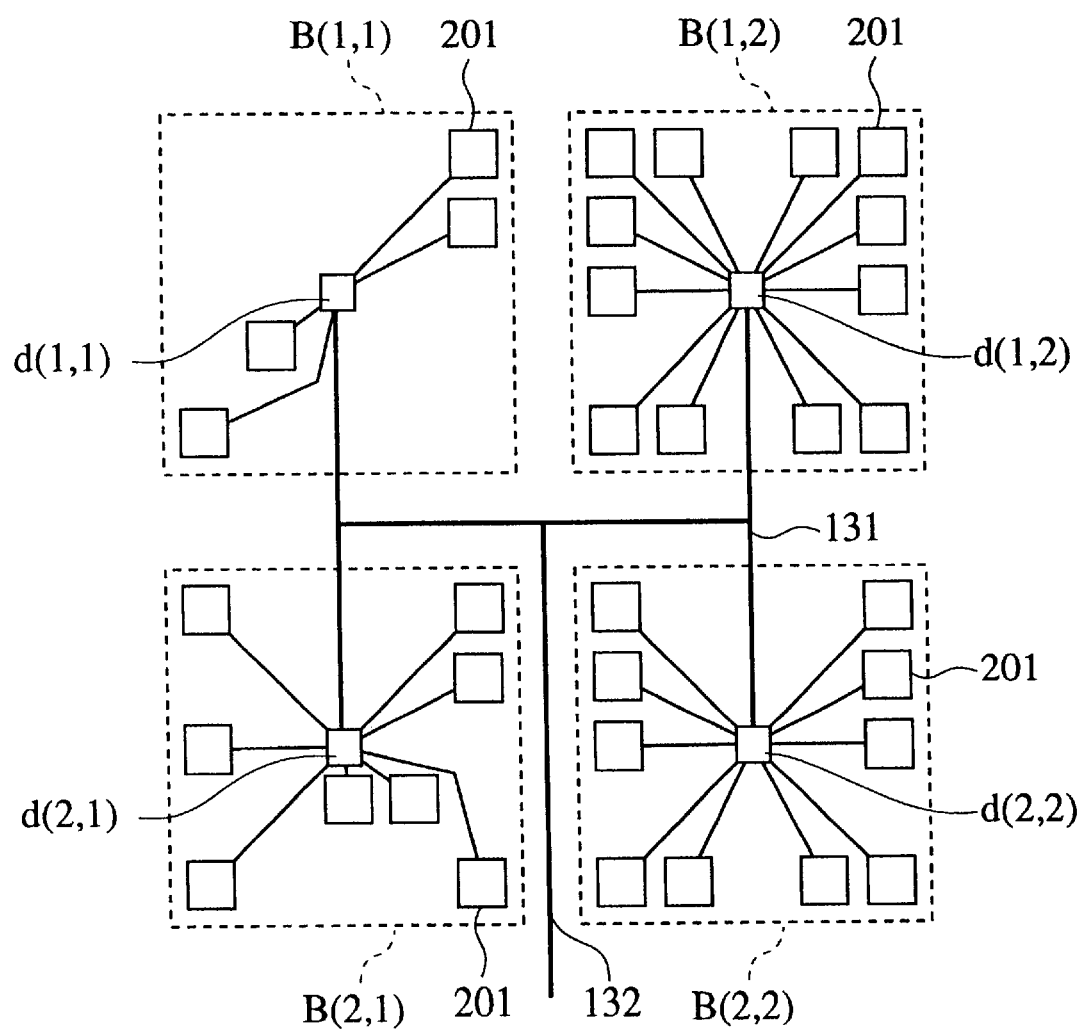
FIG. 5(A) is a partial enlargement giving a summary view of the structure of the integrated circuit of the second preferred embodiment.
Figure 5B:
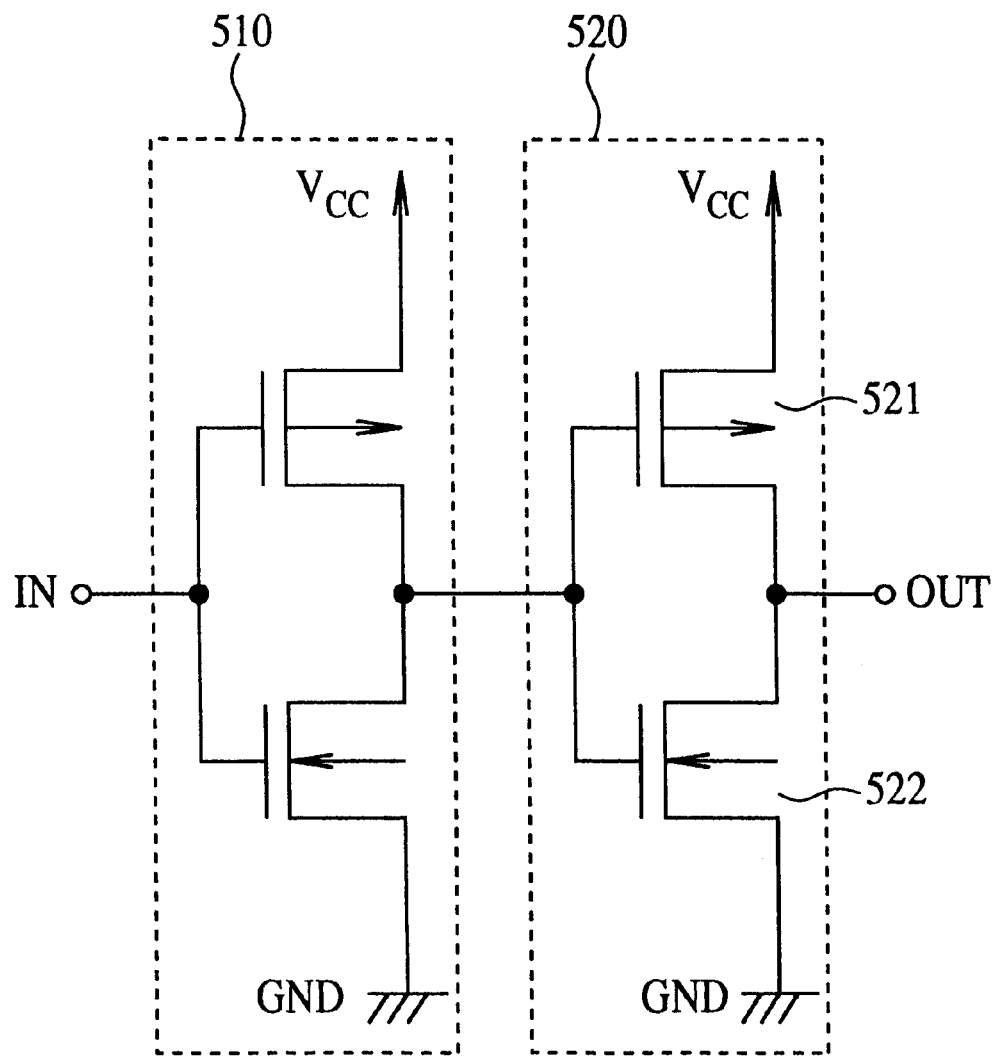
FIG. 5(B) is a diagram of the internal structure of a clock driver.
Figure 6:
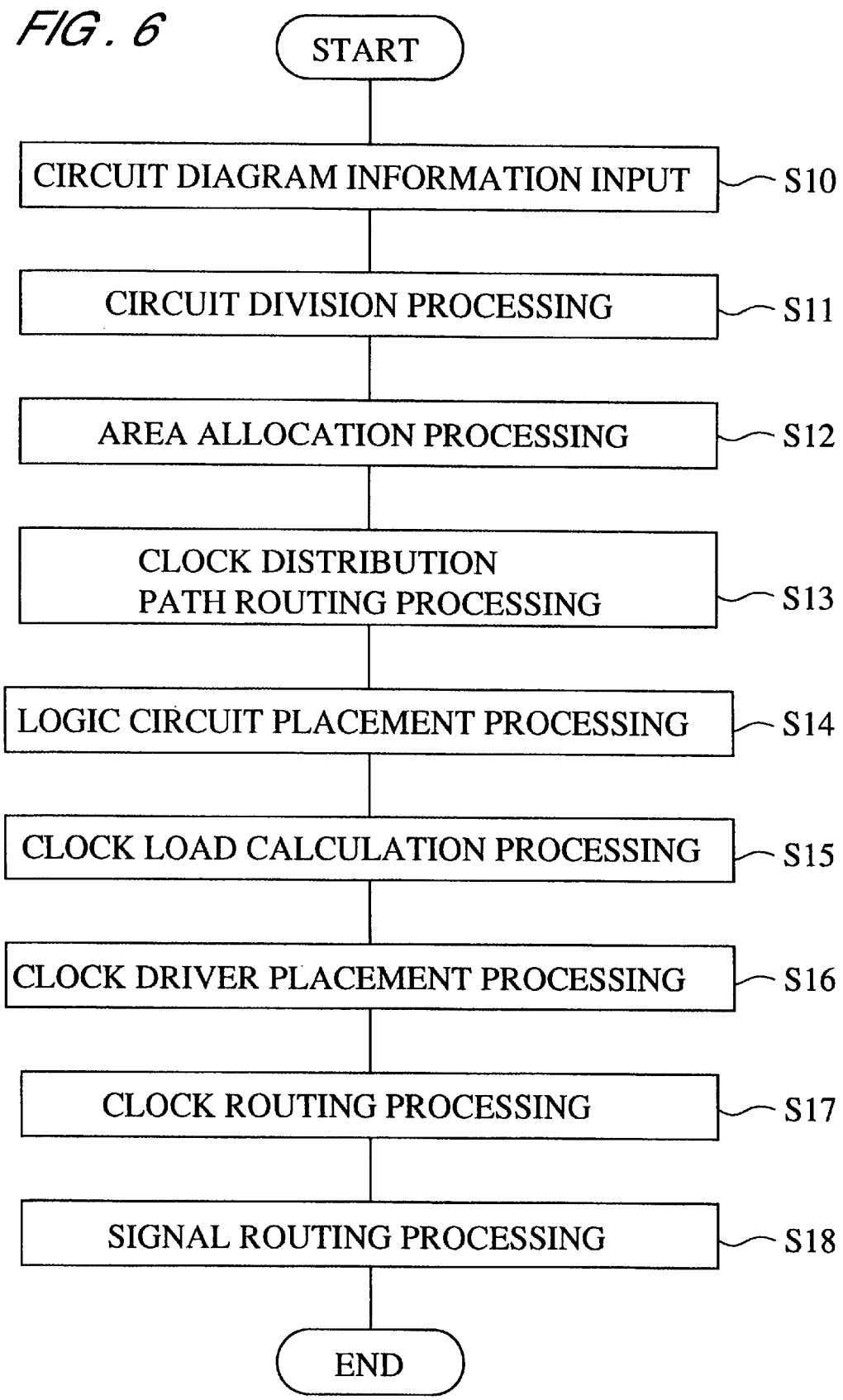
FIG. 6 is a flow chart which explains the integrated circuit design method of the second preferred embodiment.

Next, we will explain a second preferred embodiment of the invention using FIGS. 5 and 6 for reference.

The overall structure of the integrated circuit of this preferred embodiment is the same as that in FIG. 1.

As shown in FIG. 5(A), with this preferred embodiment, clock driver d(1, 1) to d(n, m) and basic logic circuits 201 are formed in each block B(1, 1) to B(n, m).

Basic logic circuits 201 are connected to the drivers in each block. Drivers d(1, 1) to d(n, m) amplify clock signals input from input terminal 120, and supply this to circuit 201 within the same block.

With this preferred embodiment, clock drivers d(1, 1) to d(n, m) are formed by inverters of multiple levels. FIG. 5(B) shows a case where the inverter has two levels.

In the two level inverter shown in FIG. 5(B), as first level inverter 510, the same standards are used for all drivers d(1, 1) to d(n, m). On the other hand, the standards (i.e. drive capacity) of second level inverter 520 is determined by the load of the driver. In other words, with this preferred embodiment, the internal impedance of inverter 502 is set according to the size of the load connected to the driver. This internal impedance can be adjusted using the gate length and gate width values of PMOS transistor 521 and NMOS transistor 522 that form inverter 502.

For example, there are 8 basic logic components 201 connected to driver d(1, 1), and there are 4 basic logic components 201 connected to driver d(1, 2), so the drive capacity of second level inverter 522 of driver d(1, 1) is set to twice the drive capacity of second level inverter 522 of driver d(1, 2). In other words, the internal impedance of second level inverter 522 of driver d(1, 1) is set to ½ the internal impedance of second level impedance 522 of driver d(1, 2). In the same way, driver d(2, 2) has 10 basic logic components 201 connected, so the drive capacity of second level inverter 522 is set to 2.5 times that of driver d(1, 2). Also, driver d(2, 1) has 12 basic logic components 201 connected, so the drive capacity of second level inverter 522 is set to 3 times that of driver d(1, 2).

In other words, with this preferred embodiment, by adjusting the internal impedance according to the number of basic logic components 201, the clock delay time for each block B(1, 1) to B(n, m) is made uniform, and thus the generation of clock skew is suppressed.

Next, we will explain the design procedure for the integrated circuit of this preferred embodiment using FIG. 6 for reference. This design procedure can be realized using a system such as a layout CAD system as was the case for the first preferred embodiment.

First, as step S10, an integrated circuit net list is input to the CAD system.

Next, as steps S11 through S14, in the same manner as with the first preferred embodiment, circuit division processing, area allocation processing, clock wiring within area 110, and logic circuit layout are performed on the CAD system.

Next, as step S15, clock load calculation is performed. With this process, the total value for the load of basic logic circuits 201 is calculated for each block B(1, 1) to B(n, m).

With step S16, clock driver layout is performed. With this process, the clock drivers placed during step 13 are replaced by 2 level inverters according to the calculated value from step S15 while referring to clock driver information registered in a library, etc.

With step S17, clock wiring within blocks is performed. With this process, wiring of each driver d(1, 1) to d(n, m) and each circuit 201 and 202 is performed.

Finally, with step S18, signal wiring is performed. With this process, wiring between each basic logic circuit 201 is performed based on the net list.

When this kind of layout and wiring process is completed, as with the first preferred embodiment, the final integrated circuit layout is completed by repeating tests by simulation, etc. and design changes.

As described above, with this preferred embodiment, the parasitic capacitance and parasitic resistance from input terminal 120 to each driver d(1, 1) to d(n, m) is made the same, and the drive capacity of the first level inverter 501 of each driver d(1, 1) to d(n, m) is made the same, so it is possible to suppress clock skew between input terminal 120 and inverter 501. Furthermore, with this preferred embodiment, by adjusting the internal impedance of second level inverter 502 of driver d(1, 1) to d(n, m), it is possible to suppress clock skew between inverter 502 and each basic logic component 201. Therefore, with this preferred embodiment, it is possible to suppress clock skew for the overall integrated circuit, making it possible to provide an integrated circuit for which high speed logic operation is possible.

Also, with this preferred embodiment, dummy load 202 is not used, so compared to the first preferred embodiment, it is not only possible to reduce clock signal power consumption, but also to reduce the circuit scale.

With the aforementioned first and second preferred embodiments, clock signals were input from external circuits, but it is also possible to install a clock generating device within integrated circuit 100.

Also, with the first and second preferred embodiments, an amplifier can be installed in any suitable position within wiring pattern 130.

With the first preferred embodiment described above, each dummy load 202 was formed on the same scale and the load size was adjusted by the number of dummy loads 202, but it is also possible to use multiple types of dummy loads with differing capacitance to adjust load size.

With the second preferred embodiment described above, the first level inverter 501 of each driver D(1, 1) to D(n, m) was made to the same scale, and the internal impedance of second level inverter 502 was adjusted, but it is also possible to have a 3 level inverter, and to adjust internal impedance of an inverter other than the second level inverter. However, with wiring pattern 130, to suppress generation of phase difference of the clock signals, it is best to have the first level inverter 501 of each driver D(1, 1) to D(n, m) be the same scale.

As described in detail above, with the integrated circuit of this invention, it is possible to suppress generation of clock skew and to have high speed logic operation.

Also, with the integrated circuit design method of this invention, it is possible to design the integrated circuit of this invention easily.

What is claimed is:

1. An integrated circuit having an integrated circuit forming area segmented into multiple blocks, said integrated circuit comprising:

a clock driver formed on each of the blocks;

multiple logic circuits formed on each of the blocks, each of said multiple logic circuits formed on a same one of the blocks being connected to said clock driver formed on the same block; and one or more dummy circuits formed on at least one of the blocks, each of said one or more dummy circuits formed on a same one of the blocks being connected to said clock driver formed on the same block;

wherein a load size of said one or more dummy circuits is determined such that a sum of a total load size of said one or more dummy circuits and the multiple logic circuits formed on a same one of the blocks is the same for all of the blocks.

2. An integrated circuit as claimed in claim 1, wherein each of said one or more dummy circuits has a same load size, and a total load size of each of the blocks is adjusted according to a number of said one or more dummy circuits formed thereon.

3. An integrated circuit as claimed in claim 1, wherein each of said one or more dummy circuits is a capacitor.

4. An integrated circuit as claimed in claim 3, wherein said capacitor comprises:
   a PMOS transistor which has a control gate, a source terminal, and a drain terminal, wherein said source terminal is supplied with a first voltage and said drain terminal is connected to said source terminal; and
   an NMOS transistor which has a control gate, a source terminal, and a drain terminal, wherein said source terminal of said NMOS transistor is supplied with a second voltage which is not equal to the first voltage and said drain terminal of said NMOS transistor is connected to said source terminal of said NMOS transistor.

5. An integrated circuit as claimed in claim 1, wherein a total value of parasitic resistance and a total value of parasitic capacitance of a wiring pattern operable to supply clock signals to said clock driver formed on each of the blocks is the same between all of said clock drivers.

6. An integrated circuit having an integrated circuit forming area segmented into multiple blocks, said integrated circuit comprising:
   a clock driver formed on each of the blocks; and
   multiple logic circuits formed on each of the blocks, each of said multiple logic circuits formed on a same one of the blocks being connected to said clock driver formed on the same block;
   wherein said clock driver formed on each of the blocks comprises an adjust inverter and wherein a drive capacity of adjust inverters on the blocks is determined such that a ratio of a size of the drive capacity to a total load size of said multiple logic circuits formed on a same one of the blocks is the same for all of the blocks.

7. An integrated circuit as claimed in claim 6, wherein the drive capacity of each of said adjust inverters are adjusted by changing an internal impedance therein.

8. An integrated circuit as claimed in claim 6, wherein said clock driver of each of the blocks has fundamental inverters for input of the clock signal and output of the clock signal to said adjust inverters of each of the blocks, respectively.

9. An integrated circuit as claimed in claim 8, wherein each of said fundamental inverters has a same drive capacity.

10. A design method for an integrated circuit having a integrated circuit forming area segmented into multiple blocks, said method comprising:
    forming a clock driver on each of the blocks;
    forming multiple logic circuits on each of the blocks, each of the multiple logic circuits formed on a same one of the blocks being connected to the clock driver formed on the same block; and
    forming one or more dummy circuits on at least one of the blocks, each of the one or more dummy circuits formed on a same one of the blocks being connected to the clock driver formed on the same block;
    wherein a load size of the one or more dummy circuits is determined such that a sum of a total load size of the one or more dummy circuits and the multiple logic circuits formed on a same one of the blocks is the same for all of the blocks.

11. A design method as claimed in claim 10, wherein each of the one or more dummy circuits is provided with a same load size, and a total load size of each of the blocks is adjusted according to a number of the one or more dummy circuits formed thereon.

12. A design method as claimed in claim 10, wherein each of the one or more dummy circuits is a capacitor.

13. A design method as claimed in claim 12, wherein the capacitor comprises:
    a PMOS transistor which has a control gate, a source terminal, and a drain terminal, wherein the source terminal is supplied with a first voltage and the drain terminal is connected to the source terminal; and
    an NMOS transistor which has a control gate, a source terminal, and a drain terminal, wherein the source terminal of said NMOS transistor is supplied with a second voltage which is not equal to the first voltage and the drain terminal of said NMOS transistor is connected to the source terminal of said NMOS transistor.

14. A design method as claimed in claim 10, wherein a total value of parasitic resistance and a total value of parasitic capacitance of a wiring pattern operable to supply clock signals to the clock driver formed on each of the blocks is provided to be the same between all of the clock drivers.

15. A design method for an integrated circuit having a integrated circuit forming area segmented into multiple blocks, said method comprising:
    forming a clock driver on each of the blocks; and
    forming multiple logic circuits on each of the blocks, each of the multiple logic circuits formed on a same one of the blocks being connected to the clock driver formed on the same block;
    wherein the clock driver formed on each of the blocks comprises an adjust inverter and wherein a drive capacity of adjust inverters on the blocks is determined such that a ratio of a size of the drive capacity to a total load size of the multiple logic circuits formed on a same one of the blocks is the same for all of the blocks.

16. A design method as claimed in claim 15, wherein the drive capacity of each of the adjust inverters are adjusted by changing an internal impedance therein.

17. A design method as claimed in claim 15, wherein the clock driver of each of the blocks has fundamental inverters for input of a clock signal and output of a clock signal to the adjust inverters of each of the blocks, respectively.

18. A design method as claimed in claim 17, wherein each of the fundamental inverters is provided with a same drive capacity.

* * * * *